United States Patent
Lee et al.

(10) Patent No.: US 12,237,049 B2
(45) Date of Patent: Feb. 25, 2025

(54) SEMICONDUCTOR MEMORY DEVICES HAVING EFFICIENT SERIALIZERS THEREIN FOR TRANSFERRING DATA

(71) Applicant: Samsung Electronics Co., Ltd., Suwon-si (KR)

(72) Inventors: Sanguk Lee, Suwon-si (KR); Daehyun Kwon, Suwon-si (KR); Jang-Woo Ryu, Suwon-si (KR); Hangi Jung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 178 days.

(21) Appl. No.: 18/052,976

(22) Filed: Nov. 7, 2022

(65) Prior Publication Data

US 2023/0368824 A1 Nov. 16, 2023

(30) Foreign Application Priority Data

May 12, 2022 (KR) ........................ 10-2022-0058616

(51) Int. Cl.
*G11C 7/22* (2006.01)
*G11C 7/10* (2006.01)
*G11C 11/4076* (2006.01)
*G11C 11/4093* (2006.01)

(52) U.S. Cl.
CPC ............ *G11C 7/222* (2013.01); *G11C 7/1093* (2013.01); *G11C 7/1096* (2013.01); *G11C 7/225* (2013.01); *G11C 11/4076* (2013.01); *G11C 11/4093* (2013.01)

(58) Field of Classification Search
CPC ...... G11C 7/222; G11C 7/1093; G11C 7/1096; G11C 7/225; G11C 11/4076; G11C 11/4093
See application file for complete search history.

(56) References Cited

U.S. PATENT DOCUMENTS

| | | | | |
|---|---|---|---|---|
| 6,970,116 B2 * | 11/2005 | Masaki | ................ | H03K 17/693 341/101 |
| 7,154,918 B2 * | 12/2006 | Takauchi | ................ | H03M 9/00 370/537 |
| 8,203,900 B2 * | 6/2012 | Lee | ...................... | G11C 11/4093 365/219 |
| 8,289,807 B2 | 10/2012 | Booth et al. | | |
| 8,743,642 B2 * | 6/2014 | Lee | ...................... | G11C 11/4093 365/219 |
| 8,912,933 B1 | 12/2014 | Zhang et al. | | |
| 9,100,029 B2 * | 8/2015 | Lee | ......................... | H03M 9/00 |

(Continued)

FOREIGN PATENT DOCUMENTS

| KR | 100499157 B1 | 7/2005 |
|---|---|---|
| KR | 101543704 B1 | 8/2015 |

(Continued)

*Primary Examiner* — Son L Mai
(74) *Attorney, Agent, or Firm* — Myers Bigel, P.A.

(57) ABSTRACT

An integrated circuit memory device includes a serializer configured to convert a plurality of bits of parallel read data, which are synchronized with a corresponding plurality of clock signals that are out-of-phase relative to each other, into a serial stream of the read data. This conversion is performed using a Boolean logic circuit, which is configured to receive each of the plurality of bits of parallel read data and each of the plurality of out-of-phase clock signals at corresponding inputs thereof.

19 Claims, 9 Drawing Sheets

(56) References Cited

U.S. PATENT DOCUMENTS

| | | | |
|---|---|---|---|
| 9,674,025 B2* | 6/2017 | Dickson | H04L 27/01 |
| 10,110,334 B2* | 10/2018 | Gupta | H04L 7/0037 |
| 10,419,202 B2* | 9/2019 | Lee | H04L 7/0041 |
| 10,658,041 B1* | 5/2020 | Pilolli | G11C 16/10 |
| 11,804,838 B2* | 10/2023 | Park | H03K 19/20 |
| 2006/0104124 A1 | 5/2006 | Padaparambil | |
| 2008/0265967 A1 | 10/2008 | Goller | |

FOREIGN PATENT DOCUMENTS

| | | |
|---|---|---|
| KR | 102006022 B1 | 8/2019 |
| KR | 20200117634 A | 10/2020 |

* cited by examiner

SEMICONDUCTOR MEMORY DEVICES HAVING EFFICIENT SERIALIZERS THEREIN FOR TRANSFERRING DATA

REFERENCE TO PRIORITY APPLICATION

This application claims priority under 35 U.S.C. § 119 to Korean Patent Application No. 10-2022-0058616, filed May 12, 2022, the disclosure of which is hereby incorporated herein by reference.

BACKGROUND

Embodiments of the present disclosure described herein relate to integrated circuit devices and, more particularly, to integrated circuit devices that support efficient data transfer.

A semiconductor memory device may be mainly classified into a volatile semiconductor memory device and a non-volatile semiconductor memory device. Although the volatile semiconductor memory device reads or writes data at a higher data rate, information may be lost from the volatile semiconductor memory device when power is cut off. To the contrary, the non-volatile semiconductor memory device retains data stored therein, even after power is cut off. Accordingly, the non-volatile semiconductor memory device is used to store data that needs to be retained regardless of the supply of the power.

The semiconductor memory device may exchange data with a host. For example, the semiconductor memory device may receive write data from the host, and store the write data. The semiconductor memory device may read data in response to the request of the host, and may transmit the read data to the host. In this case, a scheme of transmitting data may be classified into a serial transmission scheme and a parallel transmission scheme. The serial transmission scheme is to sequentially transmit data by one bit through one transmission line, and the parallel transmission scheme is to simultaneously transmit data having multiple bits through multiple transmission lines.

The serial transmission scheme has advantages in cost and design by reducing the number of transmission lines. However, since the serial transmission scheme is to sequentially transmit data through one transmission line, a lower data rate is shown. On the contrary, since the parallel transmission scheme is to simultaneously transmit multiple data through multiple transmission lines, a higher data rate is shown. However, the parallel transmission scheme has disadvantages in cost and design since the number of transmission lines is increased. Meanwhile, a process for converting data, which is read in parallel (e.g., from the semiconductor memory device), to serial data is required, such that a larger amount of data is transmitted through one transmission line of multiple transmission lines, even if the multiple transmission lines are used.

SUMMARY

Embodiments of the present disclosure provide a serializer to output serial data by combining some of multiple clocks having a specific phase difference therebetween and parallel data (when converting the parallel data to serial data), and a semiconductor memory device including the same.

According to an embodiment, an integrated circuit memory device includes a serializer configured to convert a plurality of bits of parallel read data, which are synchronized with a corresponding plurality of clock signals that are out-of-phase relative to each other, into a serial stream of the read data. This serializer uses a Boolean logic circuit, which is configured to receive each of the plurality of bits of parallel read data and each of the plurality of out-of-phase clock signals at corresponding inputs thereof. This Boolean logic circuit may be a type of combinational logic, which is sometimes referred to as time-independent logic or combinatorial logic and which is implemented by Boolean circuits, where the output is a pure function of the present input(s) only. In some of these embodiments, the serializer includes: (i) a first multiplexer (MUX), which is configured to receive a first of the plurality of bits of parallel read data and first and second ones of the plurality of clock signals (CK1, CK2), (ii) a second MUX, which is configured to receive a third of the plurality of bits of parallel read data and third and fourth ones of the plurality of clock signals (CK3, CK4), (iii) a third MUX, which is configured to receive a second of the plurality of bits of parallel read data and the second and third ones of the plurality of clock signals, and (iv) a fourth MUX, which is configured to receive a fourth of the plurality of bits of parallel read data and the fourth and first ones of the plurality of clock signals.

In some of these embodiments, the first multiplexer may be configured to include a first logic gate that receives the first one of the plurality of clock signals and the first of the plurality of bits of parallel read data, and a second logic gate that receives the second one of the plurality of clock signals and the first of the plurality of bits of parallel read data. In addition, the second one of the plurality of clock signals may be phase-delayed by 90° relative to the first one of the plurality of clock signals, the third one of the plurality of clock signals may be phase-delayed by 90° relative to the second one of the plurality of clock signals, and the fourth one of the plurality of clock signals may be phase-delayed by 90° relative to the third one of the plurality of clock signals. In addition, the serializer may further include a serializing circuit having a first logic gate that receives first and second outputs of the first and second multiplexers, respectively, and a second logic gate that receives third and fourth outputs of the third and fourth multiplexers, respectively. In some embodiments, the first logic gate may be a two-input NAND gate, and the second logic gate may be a two-input NAND gate. The serializer may also include combinational logic that performs a logical-OR operation on signals generated at outputs of the first and second NAND gates.

According to another embodiment of the invention, a semiconductor memory device may include a memory core including a plurality of memory cells, a data transmitting unit including a serializer to receive parallel data from the memory core and to convert the parallel data to serial data, and control logic. The control logic is configured to controls the memory core to output the parallel data, and to generate multiple internal clock signals by receiving a clock signal from a host. The serializer may include a plurality of multiplexers, with each multiplexer configured to output an inverted data signal based on one of the parallel data and two internal clock signals, which have phases different from each other, of the multiple internal clock signals, and a serializing circuit to output the serial data by logically combining inverted data signals output from the plurality of multiplexers. Each of the plurality of multiplexers may acquire inverted data of the one of the parallel data between rising edges of the two internal clock signals and generate each of the inverted data signals.

According to some embodiments, the serializing circuit may generate intermediate signals such that at least two data of the parallel data are alternately aligned at a specific time interval.

According to further embodiments, the serializing circuit may generate the serial data, which is formed by sequentially aligning all data included in the parallel data, by combining the intermediate signals based on a specific phase difference. According to an embodiment, the two internal clock signals may have a phase difference of 90 degrees. According to an embodiment, at least two multiplexers of the plurality of multiplexers may receive the same internal clock signal. According to an embodiment, one multiplexer of the plurality of multiplexers may receive an internal clock signal different from an internal clock signal of another multiplexer of the plurality of multiplexers. According to an embodiment, one of internal clock signals input to one multiplexer of the plurality of multiplexers may have a phase difference of 90 degrees from one of internal clock signals input to another multiplexer of the plurality of multiplexers. According to an embodiment, one of the parallel data may be synchronized with a high level duration of one of the two internal clock signals.

According to a further embodiment, a serializer of a semiconductor memory device may include a plurality of multiplexers, with each multiplexer configured to output an inverted data signal based on one of parallel data and two clock signals having mutually different phases, and a serializing circuit configured to output serial data by logically combining inverted data signals output from the plurality of multiplexers. Each of the plurality of multiplexers may acquire inverted data of one of the parallel data between rising edges of the two clock signals and may generate the inverted data signals.

According to an embodiment, the parallel data may include first data, second data, third data, and fourth data input in parallel. The plurality of multiplexers may include a first multiplexer configured to output a first inverted data signal corresponding to the first data, based on a first clock signal and a second clock signal, a second multiplexer configured to output a second inverted data signal corresponding to the third data, based on a third clock signal and a fourth clock signal, a third multiplexer configured to output a third inverted data signal corresponding to the second data, based on the second clock signal and the third clock signal, and a fourth multiplexer configured to output a fourth inverted data signal corresponding to the fourth data, based on the fourth clock signal and the first clock signal. The serializing circuit may output the serial data by logically combining the first inverted data signal, the second inverted data signal, the third inverted data signal, and the fourth inverted data signal.

According to an embodiment, the serializing circuit may include a first NAND circuit configured to output a first intermediate signal having the first data and the third data alternately aligned at a specific time interval by performing a NAND operation for the first inverted data signal and the second inverted data signal, a first inverter configured to output a first inverted intermediate signal by inverting the first intermediate signal, a second NAND circuit configured to output a second intermediate signal having the second data and the fourth data alternately aligned at a specific time interval by performing a NAND operation for the third inverted data signal and the fourth inverted data signal, a second inverter configured to output a second inverted intermediate signal by inverting the second intermediate signal, and a third NAND circuit configured to output the serial data having the first data, the second data, the third data, and the fourth data sequentially aligned by performing a NAND operation for the first inverted intermediate signal and the second inverted intermediate signal.

According to an embodiment, the first intermediate signal may include the first data, which is acquired at a rising edge of the first clock signal and a rising edge of the second clock signal, and the third data which is acquired at a rising edge of the third clock signal and a rising edge of the fourth clock signal, and the second intermediate signal may include the second data, which is acquired at the rising edge of the second clock signal and the rising edge of the third clock signal, and the fourth data acquired at the rising edge of the fourth clock signal and the rising edge of the first clock signal.

According to an embodiment, the second clock signal may be delayed by 90 degrees from the first clock signal, the third clock signal may be delayed by 90 degrees from the second clock signal, and the fourth clock signal may be delayed by 90 degrees from the third clock signal, where 90 degrees corresponds to T/4 and "T" corresponds to a period of the clock signal (i.e., 360 degrees).

According to an embodiment, the first data may be synchronized with a high level duration of the first clock signal, the second data may be synchronized with a high level duration of the second clock signal, the third data may be synchronized with a high level duration of the third clock signal, and the fourth data may be synchronized with a high level duration of the fourth clock signal According to an embodiment, the first multiplexer may include a first NAND circuit configured to output a first internal signal by performing a NAND operation for the first clock signal and the first data, a first inverter configured to output a first sub-intermediate signal by inverting the first internal signal, and a second NAND circuit configured to output a second internal signal by performing a NAND operation for the second clock signal and the first data. The second multiplexer may include a third NAND circuit configured to output a third internal signal, based on the third clock signal and the third data, a second inverter configured to output a second sub-intermediate signal by inverting the third internal signal, and a fourth NAND circuit configured to output a fourth internal signal based on the fourth clock signal and the third data. The third multiplexer may include a fifth NAND circuit configured to output a fifth internal signal, based on the second clock signal and the second data, a third inverter configured to output a third sub-intermediate signal by inverting the fifth internal signal, and a sixth NAND circuit configured to output a sixth internal signal, based on the third clock signal and the second data. The fourth multiplexer may include a seventh NAND circuit configured to output a seventh internal signal, based on the fourth clock signal and the fourth data, a fourth inverter configured to output a fourth sub-intermediate signal by inverting the seventh internal signal, and an eighth NAND circuit configured to output an eighth internal signal based on the first clock signal and the fourth data.

According to an embodiment, the first multiplexer may further include a first transmission gate configured to output a first sub-inverted intermediate signal by receiving the second internal signal, such that the first internal signal and the second internal signal maintain a phase difference, and a ninth NAND circuit configured to output the first inverted data signal by performing a NAND operation for the first sub-intermediate signal and the first sub-inverted intermediate signal. The second multiplexer may further include a second transmission gate configured to output a second sub-inverted intermediate signal by receiving the fourth internal signal, such that the third internal signal and the fourth internal signal maintain a phase difference, and a tenth NAND circuit configured to output the second inverted data signal, based on the second sub-intermediate signal and the second sub-inverted intermediate signal. The third multiplexer may further include a third transmission gate configured to output a third sub-inverted intermediate signal by receiving the sixth internal signal, such that the fifth internal signal and the sixth internal signal maintain a phase difference, and an eleventh NAND circuit configured to output the third inverted data signal based on the third sub-intermediate signal and the third sub-inverted intermediate signal. The fourth multiplexer may further include a fourth transmission gate configured to output a fourth sub-inverted intermediate signal by receiving the eighth internal signal, such that the seventh internal signal and the eighth internal signal maintain a phase difference, and a twelfth NAND circuit configured to output the fourth inverted data signal, based on the fourth sub-intermediate signal and the fourth sub-inverted intermediate signal.

According to an embodiment, the first sub-intermediate signal may include the first data to correspond to a high level duration of the first clock signal, the second sub-intermediate signal may include the third data to correspond to a high level duration of the third clock signal, the third sub-intermediate signal may include the second data to correspond to a high level duration of the second clock signal, the fourth sub-intermediate signal may include the fourth data to correspond to a high level duration of the fourth clock signal, the first sub-inverted intermediate signal may include inverted data of the first data to correspond to a high level duration of the second clock signal, the second sub-inverted intermediate signal may include inverted data of the third data to correspond to a high level duration of the fourth clock signal, the third sub-inverted intermediate signal may include inverted data of the second data to correspond to a high level duration of the third clock signal, and the fourth sub-inverted intermediate signal may include inverted data of the fourth data to correspond to a high level duration of the first clock signal.

According to an embodiment, the first inverted data signal may include inverted data of the first data acquired at a rising edge of the first clock signal and a rising edge of the second clock signal, the second inverted data signal may include inverted data of the third data acquired at a rising edge of the third clock signal and a rising edge of the fourth clock signal, the third inverted data signal may include inverted data of the second data acquired at a rising edge of the second clock signal and a rising edge of the third clock signal, and the fourth inverted data signal may include inverted data of the fourth data acquired at a rising edge of the fourth clock signal and a rising edge of the first clock signal.

According to an embodiment, a serializer to convert first data, second data, third data, and fourth data, which are input in parallel, to serial data, may include a first multiplexer configured to output a first inverted data signal corresponding to the first data, based on a first clock signal and a second clock signal, a second multiplexer configured to output a second inverted data signal corresponding to the third data, based on a third clock signal and a fourth clock signal, a third multiplexer configured to output a third inverted data signal corresponding to the second data, based on the second clock signal and the third clock signal, a fourth multiplexer configured to output a fourth inverted data signal corresponding to the fourth data, based on the fourth clock signal and the first clock signal, and a serializing circuit configured to output the serial data by logically combining the first inverted data signal, the second inverted data signal, the third inverted data signal, and the fourth inverted data signal. The serializing circuit may include a first NAND circuit configured to output a first intermediate signal having the first data and the third data alternately aligned at a specific time interval, by performing a NAND operation for the first inverted data signal and the second inverted data signal, a second NAND circuit configured to output a second intermediate signal having the second data and the fourth data alternately aligned at a specific time interval, by performing a NAND operation for the third inverted data signal and the fourth inverted data signal, a third NAND circuit configured to output a first inverted intermediate signal by performing a NAND operation for the first intermediate signal and a power supply voltage signal, a fourth NAND circuit configured to output a second inverted intermediate signal by performing a NAND operation for the second intermediate signal and the power supply voltage signal, and a fifth NAND circuit configured to output the serial data having the first data, the second data, the third data, and the fourth data sequentially aligned, by performing a NAND operation for the first inverted intermediate signal and the second inverted intermediate signal.

According to an embodiment, the third NAND circuit may output a first write leveling intermediate signal by performing a NAND operation for a write leveling signal substituted for the power supply voltage signal, and the first intermediate signal, the fourth NAND circuit may output a second write leveling intermediate signal by performing a NAND operation for the write leveling signal substituted for the power supply voltage signal and the second intermediate signal, and the fifth NAND circuit may output the serial data including a high voltage of the write leveling signal by performing a NAND operation for the first write leveling intermediate signal and the second write leveling intermediate signal.

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, embodiments of the present disclosure may be described in detail and clearly to such an extent that those skilled in the art easily implements of the present disclosure. In addition, in the following description, a dynamic random access memory (DRAM) may be used as an example of a semiconductor memory device to explain features and functions of the present disclosure. However, those skilled in the art may easily understand other advantages and performance of the present disclosure depending on the content disclosed here. The present disclosure may be implemented or applied through other embodiments, including other memory technologies. In addition, the detailed description may be changed or modified depending on view points and applications without departing from the claims, the scope and spirit, and any other purposes of the present disclosure.

Figure 1:
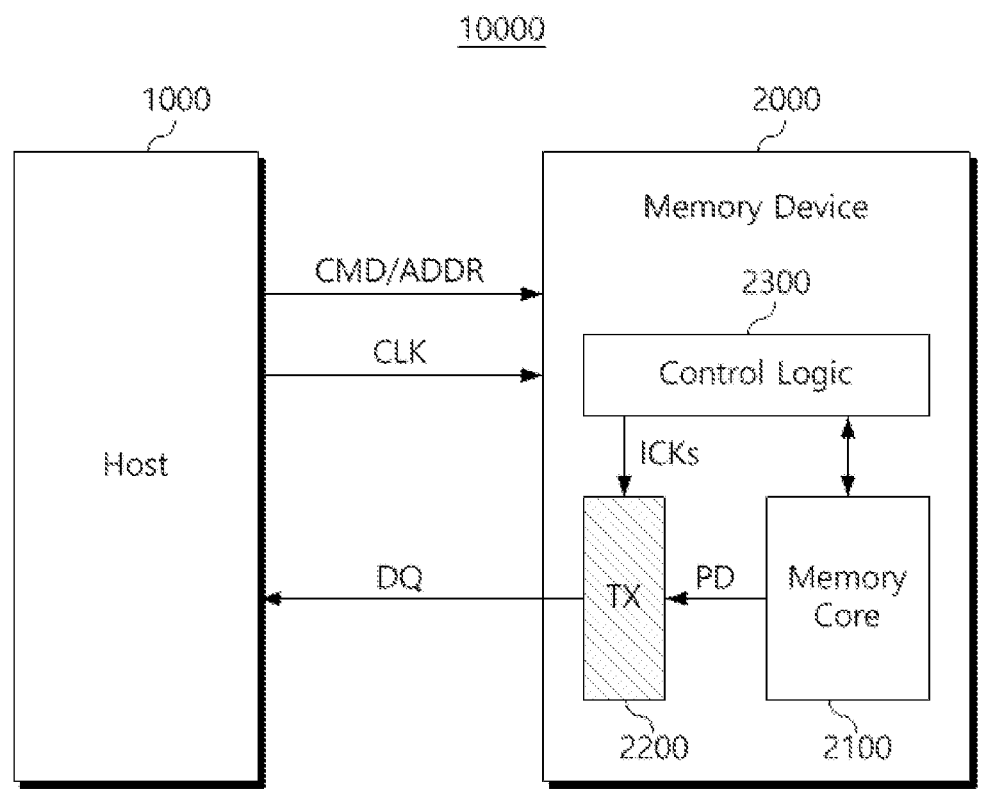
FIG. 1 is a block diagram illustrating a memory system including a memory device according to an embodiment.

FIG. 1 is a block diagram illustrating a memory system including a memory device according to an embodiment. Referring to FIG. 1, according to the present disclosure, a memory system 10000 may include a host 1000 and a memory device 2000. According to an embodiment, the host 1000 may perform an access operation of writing data on the memory device 2000 or reading data out of the memory device 2000. For example, the host 1000 may generate a command CMD and an address ADDR used to write data on the memory device 2000 or read data out of the memory device 2000. The host 1000 may be configured as a memory controller, a system on chip (SoC), such as an application processor (AP), a control processing unit (CPU) or a graphic processing unit (GPU) to control the memory device 2000.

According to an embodiment, the memory device 2000 may output read data, which is requested by the host 1000, to the host 1000, or may store write data, which is requested by the host 1000, into a memory cell The memory device 2000 may output the read data through a data line DQ in response to the request by the host 1000. The memory device 2000 may transmit the serialized data through the data line DQ.

In this case, the memory device 2000 may be a volatile memory device, such as a dynamic random access memory (DRAM), a synchronous dynamic random access memory (SDRAM), a double data rate (DDR) DRAM, a DDR SDRAM, a low power double data rate (LPDDR), an SDRAM, a graphics double data rate (GDDR) SDRAM, a rambus dynamic random access memory (RDRAM), or a static random access memory (SRAM). Alternatively, the memory device 2000 may be implemented even in the non-volatile memory device, such as a resistive random access memory (RRAM), a phase-change random access memory (PRAM), a magnetoresistive random access memory (MRAM), a ferroelectric random access memory (FRAM), or a spin transfer torque RAM (STT-RAM). In the specification, although advantages of the present disclosure are described while focusing on a DRAM, the technical spirit of the present disclosure is not limited thereto.

According to an embodiment, a memory core 2100 may include a memory cell array divided in the unit of a bank, a row decoder, a column decoder, a sensing amplifier, and a write driver. The memory core 2100 may store data, which is requested to be written, into the memory device 2000 through a write driver, and may read data, which is requested to be read, out of the memory device 2000 using the sensing amplifier. In addition, the memory core 2100 may further include a component for a refresh operation for storing and retaining the data, or selective circuits based on addresses. However, the present disclosure is not a technology related to the memory core 2100. Accordingly, the details thereof will be omitted in the following description.

According to an embodiment, a data transmitting unit 2200 may receive parallel data PD from the memory core 2100. The data transmitting unit 2200 may receive internal clock signals ICKs from control logic 2300. The data transmitting unit 2200 may convert the parallel data PD to serial data SD based on the internal clock signals ICKs, and may transmit the serial data SD to the host 1000 through the data line DQ. For example, the memory core 2100 may read the data, which is stored in a cell array in parallel, through multiple bit lines, and may output parallel data PD. The parallel data PD may be converted to the serial data SD through the data transmitting unit (TX) 2200 such that the parallel data PD is transmitted through the data line DQ. The data transmitting unit 2200 may generate the serial data SD by combining the parallel data PD and the internal clock signals ICKs in at least one stage.

According to an embodiment, the control logic 2300 may receive a control signal, such as a command CMD and an address ADDR, and a clock signal CLK from the host 1000. The control logic 2300 may control a write operation, a read operation, a delete operation for the memory device 2000 by using the control signal and the clock signal CLK. The control logic 2300 may generate various internal clock signals ICKs based on the clock signal CLK. For example, the internal clock signals ICKs may include multiple clock signals having a specific phase difference (e.g., 90 degrees) from each other. The control logic 2300 may provide the internal clock signals ICKs to the data transmitting unit 2200.

Figure 2:
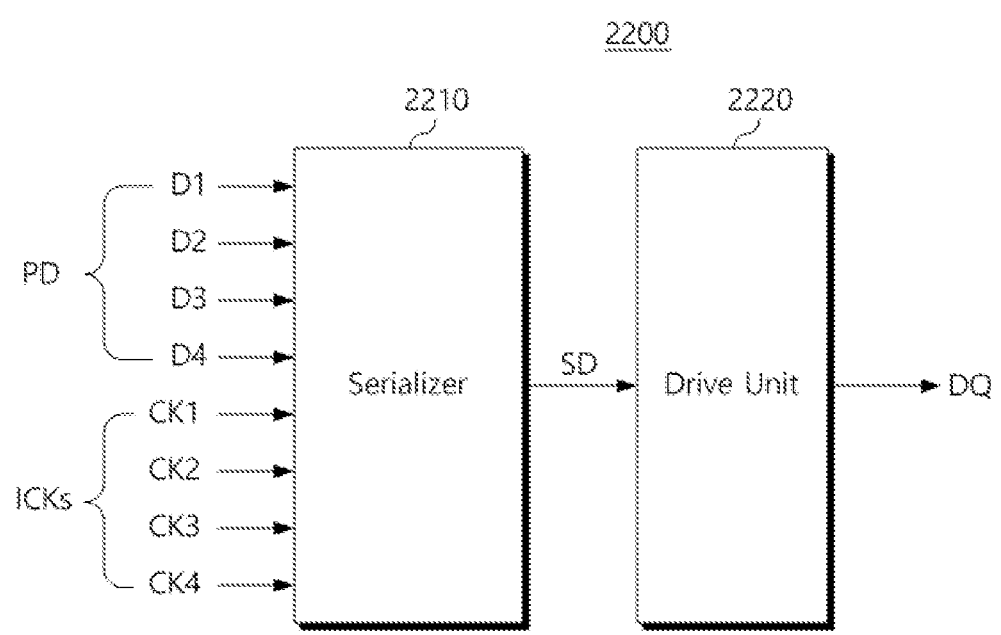
FIG. 2 is a block diagram illustrating a data transmitting unit of FIG. 1.

Referring now to FIG. 2, a block diagram of the data transmitting unit of FIG. 1 is shown. Referring to FIG. 2, the data transmitting unit 2200 may include a serializer 2210 and a drive unit 2220. According to an embodiment, the serializer 2210 may receive the parallel data PD. For example, the parallel data PD may include first data D1, second data D2, third data D3, and fourth data D4. However, this is provided only for the illustrative purpose. For example, the parallel data PD may include at least two data transmitted in parallel. The serializer 2210 may receive multiple clock signals CK1, CK2, CK3, and CK4. The multiple clock signals CK1, CK2, CK3, and CK4 may be internal clock signals which are generated, as the form of the clock signal CLK received from the host 1000 of FIG. 1 is changed.

According to an embodiment, the serializer 2210 may perform combinational logic based on the parallel data PD and the multiple clock signals CK1, CK2, CK3, and CK4 to output the serial data SD corresponding to the parallel data PD. For example, the serializer 2210 may generate one intermediate signal based on one data of the parallel data PD and two clock signals of the multiple clock signals CK1, CK2, CK3, and CK4. The serializer 2210 may generate one serial data SD by combining intermediate signals corresponding to the parallel data PD, respectively.

According to an embodiment, the serializer 2210 may sequentially receive the parallel data PD at specific time intervals. The multiple clock signals CK1, CK2, CK3, and CK4 may have a specific phase difference (e.g., 90 degrees) from each other. For example, the first clock signal CK1 may have a phase difference of 90 degrees from the second clock signal CK2; the second clock signal CK2 may have a phase difference of 90 degrees from the third clock signal CK3; the third clock signal CK3 may have a phase difference of 90 degrees from the fourth clock signal CK4; and the fourth clock signal CK4 may have a phase difference of 90 degrees from the first clock signal CK1. However, this is provided only for the illustrative purpose. For example, the number of the multiple clock signals and the phase difference between the clock signals are not limited thereto. According to an embodiment, the drive unit 2220 may drive with a specific voltage, such that the serial data SD is transmitted through the data line DQ. For example, the drive unit 2220 may include an output buffer.

Figure 3:
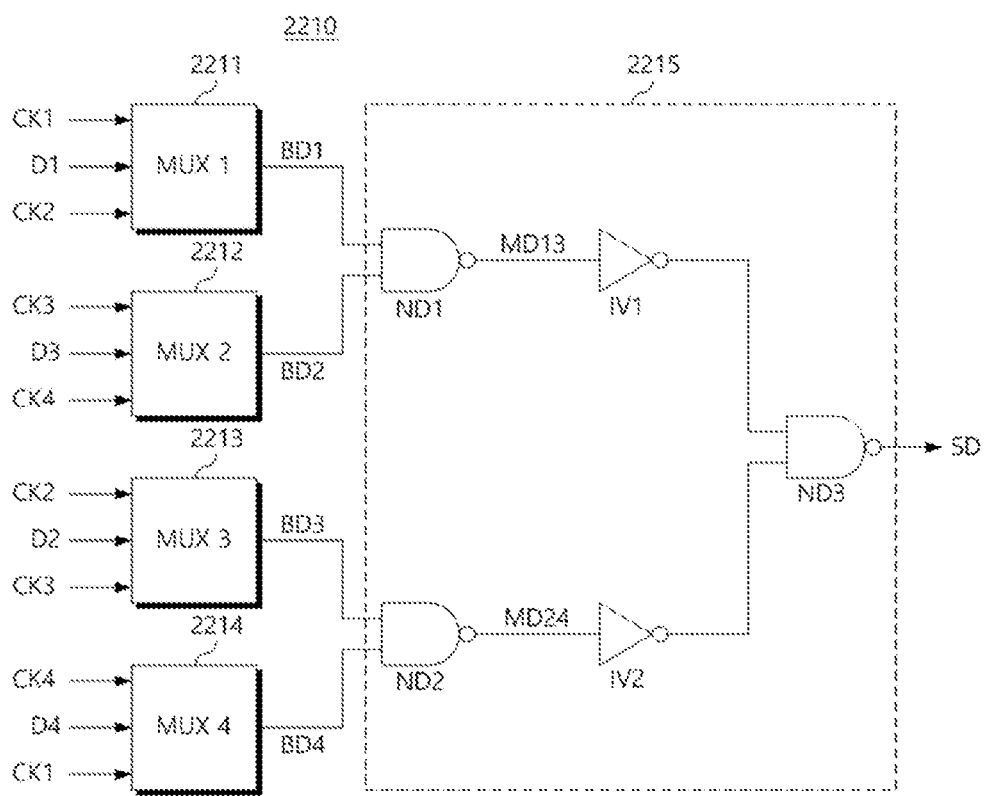
FIG. 3 is a view illustrating the serializer of FIG. 2 in detail.

FIG. 3 is a view illustrating the serializer of FIG. 2 in detail. Referring to FIG. 3, the serializer 2210 may include a plurality of multiplexers and a serializing circuit 2215. The following description will be made in that the plurality of multiplexers include a first multiplexer 2211, a second multiplexer 2212, a third multiplexer 2213, and a fourth multiplexer 2214 by way of example. However, this is provided only for the illustrative purpose. The number of the plurality of multiplexers is not limited thereto. The number of the multiplexers may be determined depending on the number of data input in parallel or the number of clock signals used.

According to an embodiment, the serializer 2210 may receive the parallel data and the multiple clock signals. For example, the parallel data PD may include the first data D1, the second data D2, the third data D3, and the fourth data D4. The multiple clock signals may include the first clock signal CK1, the second clock signal CK2, the third clock signal CK3, and the fourth clock signal CK4.

According to an embodiment, the plurality of multiplexers may output a first inverted data signal BD1, a second inverted data signal BD2, a third inverted data signal BD3, and a fourth inverted data signal BD4. The serializing circuit 2215 may output the serial data SD by logically combining the first inverted data signal BD1, the second inverted data signal BD2, the third inverted data signal BD3, and the fourth inverted data signal BD4 using a plurality of logical operations (NAND, INV).

According to an embodiment, the first multiplexer 2211 may receive the first data D1, the first clock signal CK1, and the second clock signal CK2, and may output the first inverted data signal BD1 corresponding to the first data D1. In some embodiments, the first clock signal CK1 may be a clock signal synchronized with the first data D1, and the second clock signal CK2 may be a clock signal delayed by 90 degrees relative to the first clock signal CK1. For example, the first inverted data signal BD1 may be a signal obtained by inverting the first data D1 and may be valid between a rising edge of the first clock signal CK1 and a rising edge of the second clock signal CK2.

In addition, the second multiplexer 2212 may receive the third data D3, the third clock signal CK3, and the fourth clock signal CK4. The second multiplexer 2212 may output the second inverted data signal BD2 corresponding to the third data D3. The third clock signal CK3 may be a clock signal synchronized with the third data D3, but nonetheless delayed by 90 degrees relative to the second clock signal CK2, whereas the fourth clock signal CK4 may be a clock signal delayed by 90 degrees from the third clock signal CK3. In addition, the second inverted data signal BD2 may be a signal obtained by inverting the third data D3 and may be valid between a rising edge of the third clock signal CK3 and a rising edge of the fourth clock signal CK4.

Similarly, the third multiplexer 2213 may receive the second data D2, the second clock signal CK2, and the third clock signal CK3, and may output the third inverted data signal BD3 corresponding to the second data D2. The second clock signal CK2 may be a clock signal synchronized with the second data D2, and the third inverted data signal BD3 may be a signal obtained by inverting the second data D2 and may be valid between a rising edge of the second clock signal CK2 and a rising edge of the third clock signal CK3.

Next, the fourth multiplexer 2214 may receive the fourth data D4, the fourth clock signal CK4, and the first clock signal CK1, and may output the fourth inverted data signal BD4 corresponding to the fourth data D4. The fourth clock signal CK4 may be a clock signal synchronized with the fourth data D4 and may be delayed by 270 degrees relative to the first clock signal CK1. Accordingly, the fourth inverted data signal BD4 may be a signal obtained by inverting the fourth data D4 and may be valid between a rising edge of the fourth clock signal CK4 and the rising edge of the first clock signal CK1.

These first through fourth inverted data signals BD1, BD2, BD3 and BD4 are then provided to the serializing circuit 2215, which performs various Boolean operations on these signals to thereby output serial data SD. As shown the serializing circuit 2215 may include a first NAND circuit ND1, a second NAND circuit ND2, a third NAND circuit ND3, a first inverter IV1, and a second inverter IV2. The first NAND circuit ND1 may receive the first inverted data signal BD1 and the second inverted data signal BD2 and may output a first intermediate signal MD13. The first intermediate signal MD13 may include contributions from the first data D1 and the third data D3. The second NAND circuit ND2 may receive the third inverted data signal BD3 and the fourth inverted data signal BD4 and may output a second intermediate signal MD24. The second intermediate signal MD24 may include contributions from the second data D2 and the fourth data D4.

At the output stage, the third NAND circuit ND3 may output the serial data SD by receiving a first signal, which is obtained after the first intermediate signal MD13 is inverted through the first inverter IV1, and by receiving a second signal, which is obtained after the second intermediate signal MD24 is inverted through the second inverter IV2. In this manner, the serial data SD may include contributions from the first data D1, the second data D2, the third data D3, and the fourth data D4 which are sequentially aligned in a desired serial format. As will be understood by those skilled in the art, the net Boolean operation performed by the combination of IV1, IV2 and ND3 is equivalent to a logic-OR operation performed on signals MD13 and MD24.

Figure 4:
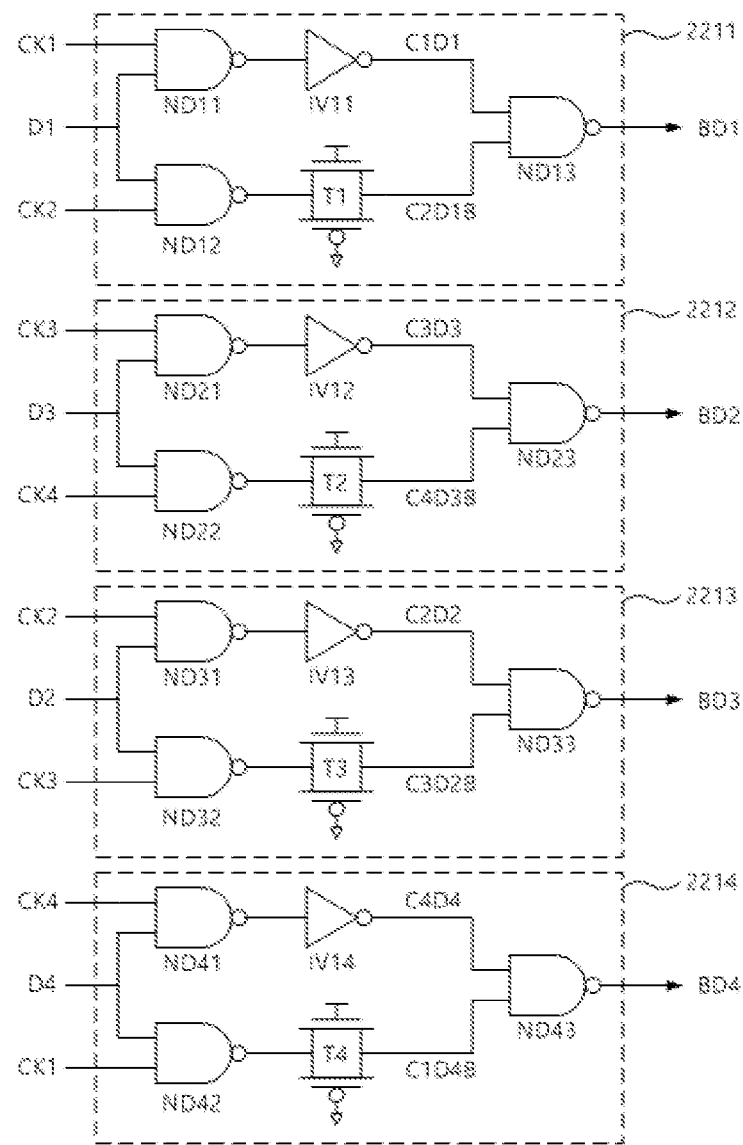
FIG. 4 is a view illustrating multiplexer of FIG. 3 in detail.

FIG. 4 is a view illustrating the four multiplexers MUX1-MUX4 of FIG. 3 in detail. As shown, each multiplexer may include a plurality of NAND gates, an inverter, and a transmission gate. In particular, the first multiplexer 2211 may include an 11th NAND circuit ND11, a 12th NAND circuit ND12, a 13th NAND circuit ND13, an 11th inverter IV11, and a first CMOS transmission gate T1, connected as illustrated. As shown, the 11th NAND circuit ND11 may generate an output signal by receiving the first data D1 and the first clock signal CK1, and then the output signal of the 11th NAND circuit ND11 may be inverted through the 11th inverter IV11 and be changed to a first sub-intermediate signal C1D1. Similarly, the 12th NAND circuit ND12 may receive the first data D1 and the second clock signal CK2 to generate an output signal. The output signal of the 12th NAND circuit ND12 may be changed to a first sub-inverted intermediate signal C2D1B through the first transmission gate T1, which provides a signal delay. The 13th NAND circuit ND13 may receive the first sub-intermediate signal C1D1 and the first sub-inverted intermediate signal C2D1B to output the first inverted data signal BD1. The first transmission gate T1 may compensate for a phase difference between the first sub-intermediate signal C1D1, which is generated by the 11th inverter IV11, and the first sub-inverted intermediate signal C2D1B.

Similarly, the second multiplexer 2212 may include a 21th NAND circuit ND21, a 22th NAND circuit ND22, a 23th NAND circuit ND23, a 12th inverter IV12, and a second transmission gate T2. For example, the 21th NAND circuit ND21 may receive the third data D3 and the second clock signal CK3 to generate an output signal. The output signal of the 21th NAND circuit ND21 may be inverted through the 12th inverter IV12 and be changed to a second sub-intermediate signal C3D3. The 22th NAND circuit ND22 may receive the third data D3 and the fourth clock signal CK4 to generate an output signal. The output signal of the 22th NAND circuit ND22 may be changed to a second sub-inverted intermediate signal C4D3B through the second transmission grate T2. The 23th NAND circuit ND23 may receive the second sub-intermediate signal C3D3 and the second sub-inverted intermediate signal C4D3B and output the second inverted data signal BD2. The second CMOS transmission gate T2 may compensate for the phase difference between the second sub-intermediate signal C3D3, which is generated by the 12th inverter IV12, and the second sub-inverted intermediate signal C4D3B.

According to an embodiment, the third multiplexer 2213 may include a 31th NAND circuit ND31, a 32th NAND circuit ND32, a 33th NAND circuit ND33, a 13th inverter IV13, and a third CMOS transmission gate T3. For example, the 31th NAND circuit ND31 may receive the second data D2 and the second clock signal CK2 to generate an output signal. The output signal of the 31th NAND circuit ND31 may be inverted through the 13th inverter IV13 and be changed to a third sub-intermediate signal C2D2. The 32th NAND circuit ND32 may receive the second data D2 and the third clock signal CK3 to generate an output signal. The output signal of the 32-end NAND circuit ND32 may be changed to a third sub-inverted intermediate signal C3D2B through the third transmission grate T3. The 33th NAND circuit ND33 may receive the third sub-intermediate signal C2D2 and the third sub-inverted intermediate signal C3D2B and output the third inverted data signal BD3. The third transmission gate T3 may compensate for the phase difference between the third sub-intermediate signal C2D2, which is generated by the 13th inverter IV13, and the third sub-inverted intermediate signal C3D2B.

According to an embodiment, the fourth multiplexer 2214 may include a 41th NAND circuit ND41, a 42th NAND circuit ND42, a 43th NAND circuit ND43, a 14th inverter IV14, and a fourth CMOS transmission gate T4. For example, the 41th NAND circuit ND41 may receive the fourth data D4 and the fourth clock signal CK4 to generate an output signal. The output signal of the 41th NAND circuit ND41 may be inverted through the 14th inverter IV14 and be converted to a fourth sub-intermediate signal C4D4. The 42th NAND circuit ND42 may receive the fourth data D4 and the first clock signal CK1 to generate an output signal. The output signal of the 42th NAND circuit ND42 may be converted to a fourth sub-inverted intermediate signal C1D4B through the fourth transmission grate T4. The 43th NAND circuit ND43 may receive the fourth inverted data signal C4D4 and the fourth sub-inverted data signal C1D4B and output the fourth inverted data signal BD4. The fourth transmission gate T4 may compensate for the phase difference between the fourth sub-intermediate signal C4D4, which is generated from the 14th inverter IV14, and the fourth sub-inverted intermediate signal C1D4B.

Figure 5:
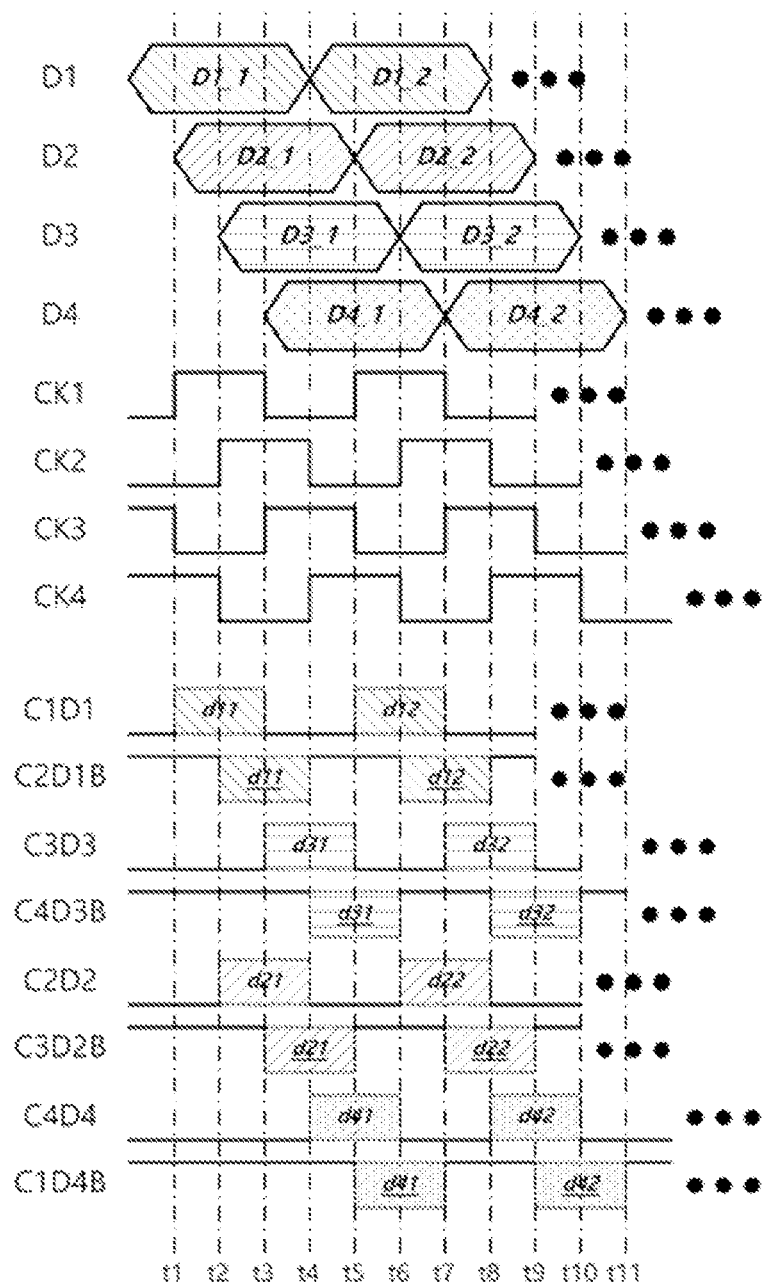
FIG. 5 is a timing diagram illustrating internal signals of the multiplexers of FIG. 4.
Figure 6:
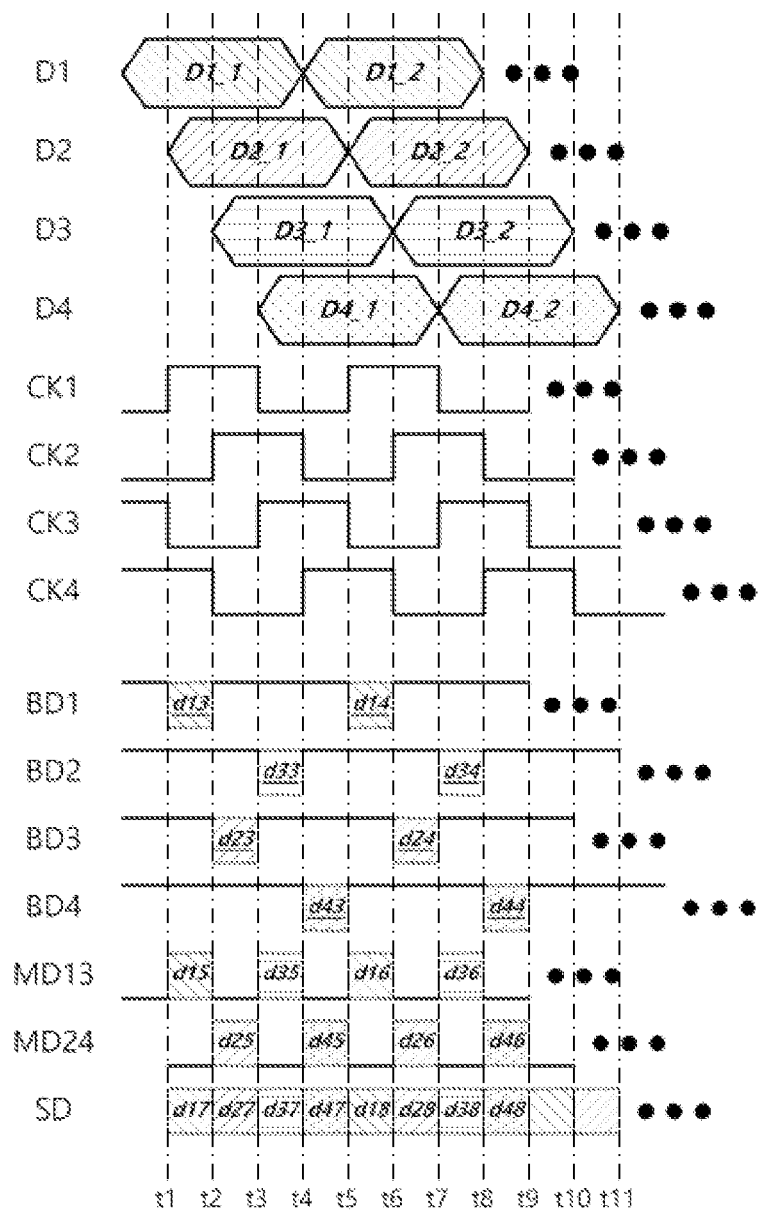
FIG. 6 is a timing diagram illustrating internal signals of a serializing circuit of FIG. 3.

FIG. 5 is a timing diagram illustrating internal signals of the multiplexers of FIG. 4, and FIG. 6 is a timing diagram illustrating internal signals of the serializing circuit of FIG. 3. Referring now to FIGS. 3 to 6, the serializer 2210 may convert the parallel data PD to the serial data SD.

According to an embodiment, the first multiplexer 2211 may generate the first sub-intermediate signal C1D1 including the first data D1 and the first sub-inverted intermediate signal C2D1B including inverted data of the first data D1, based on the first data D1, the first clock signal CK1, and the second clock signal CK2. For example, between a first time point t1 and a third time point t3 or between a fifth time point t5 and a seventh time point t7, the 11th NAND circuit ND11 may receive the first data D1 (e.g., reference signals D1_1 and D1_2) and the first clock signal CK1 to output the inverted signal of the first data D1 and the 11th inverter IV11 may output the first sub-intermediate signal C1D1 by inverting the output signal of the 11th NAND circuit ND11. The first sub-intermediate signal C1D1 may include the first data D1 (e.g., reference signs d11 and d12). The 12th NAND circuit ND12 may receive the first data D1 (e.g., reference signals D1_1 and D1_2) and the second clock signal CK2 to output the first sub-inverted intermediate signal C2D1B, between a second time point t2 and a fourth time point t4 or between a sixth time point t6 and an eighth time point t8. The first sub-inverted intermediate signal C2D1B may include inverted data (e.g., reference signs d11 and d12) of the first data D1. The first transmission gate T1 may maintain the phase difference (e.g., 90 degrees) between the first sub-intermediate signal C1D1 and the first sub-inverted intermediate signal C2D1B.

According to an embodiment, the second multiplexer 2212 may generate the second sub-intermediate signal C3D3 including the third data D3, and the second sub-inverted intermediate signal C4D3B including inverted data of the third data D3, based on the third data D3, the third clock signal CK3, and the fourth clock signal CK4. For example, between the third time point t3 and the fifth time point t5 or between the seventh time point t7 and the ninth time point t9, the 21th NAND circuit ND21 may receive the third data D3 (e.g., reference signals D3_1 and D3_2) and the third clock signal CK3 to output the inverted signal of the third data D3, and the 12th inverter IV12 may output the second sub-intermediate signal C3D3 by inverting the output signal of the 21th NAND circuit ND21. The second sub-intermediate signal C3D3 may include the third data D3 (e.g., reference signs d31 and d32). The 22th NAND circuit ND22 may receive the third data D3 (e.g., reference signals D3_1 and D3_2) and the fourth clock signal CK4 to output the second sub-inverted intermediate signal C4D3B, between the fourth time point t4 and the sixth time point t6 or between the eighth time point t8 and a tenth time point t10. The second sub-inverted intermediate signal C4D3B may include inverted data (e.g., reference signs d31 and d32) of the third data D3. The second transmission gate T2 may maintain the phase difference (e.g., 90 degrees) between the second sub-intermediate signal C3D3 and the second sub-inverted intermediate signal C4D3B.

According to an embodiment, the third multiplexer 2213 may generate the third sub-intermediate signal C2D2 including the second data D2 and the third sub-inverted intermediate signal C3D2B including inverted data of the second data D2, based on the second data D2, the second clock signal CK2, and the third clock signal CK3. For example, between the second time point t2 and the fourth time point t4 or between the sixth time point t6 and the eighth time point t8, the 31th NAND circuit ND31 may receive the second data D2 (e.g., reference signals D2_1 and D2_2) and the second clock signal CK2 to output the inverted signal of the second data D2, and the 13th inverter IV13 may output the third sub-intermediate signal C2D2 by inverting the output signal of the 31th NAND circuit ND31. The third sub-intermediate signal C2D2 may include the second data D2 (e.g., reference signs d21 and d22). The 32th NAND circuit ND32 may receive the second data D2 (e.g., reference signals D2_1 and D2_2) and the third clock signal CK3 to output the third sub-inverted intermediate signal C3D2B, between the third time point t3 and the fifth time point t5 or between the seventh time point t7 and the ninth time point t9. The third sub-inverted intermediate signal C3D2B may include inverted data (e.g., reference signs d21 and d22) of the second data D2. The third transmission gate T3 may maintain the phase difference (e.g., 90 degrees) between the third sub-intermediate signal C2D2 and the third sub-inverted intermediate signal C3D2B.

According to an embodiment, the fourth multiplexer 2214 may generate the fourth sub-intermediate signal C4D4 including the fourth data D4 and the fourth sub-inverted intermediate signal C1D4B including inverted data of the fourth data D4, based on the fourth data D4, the fourth clock signal CK4, and the first clock signal CK1. For example, between the fourth time point t4 and the sixth time point t6 or between the eighth time point t8 and the tenth time point t10, the 41th NAND circuit ND41 may receive the fourth data D4 (e.g., reference signals D4_1 and D4_2) and the fourth clock signal CK4 to output the inverted signal of the first data D4, and the 14th inverter IV14 may output the fourth sub-intermediate signal C4D4 by inverting the output signal of the 41th NAND circuit ND41. The fourth sub-intermediate signal C4D4 may include the fourth data D4 (e.g., reference signs d41 and d42). The 42th NAND circuit ND42 may receive the fourth data D4 and the first clock signal CK1 to output the fourth sub-inverted intermediate signal C1D4B, between the fifth time point t5 and the seventh time point t7 or between the ninth time point t9 and the 11th time point t11. The fourth sub-inverted intermediate signal C1D4B may include inverted data (e.g., reference signs d41 and d42) of the fourth data D4. The fourth transmission gate T4 may maintain the phase difference (e.g., 90 degrees) between the fourth sub-intermediate signal C4D4 and the fourth sub-inverted intermediate signal C1D4B.

According to an embodiment, the first multiplexer 2211 may generate the first inverted data signal BD1, based on the first sub-intermediate signal C1D1 and the first sub-inverted intermediate signal C2D1B. For example, the 13-NAND circuit ND13 may receive the first sub-intermediate signal C1D1 (e.g., reference signs d11 and d12) and the first sub-inverted intermediate signal C2D1B (e.g., reference signs d11 and d12) to output the first inverted data signal BD1 (e.g., d13 and d14) between the first time point t1 and the second time point t2 or between the fifth time pint t5 and the sixth time point t6.

According to an embodiment, the second multiplexer 2212 may generate the second inverted data signal BD2, based on the second sub-intermediate signal C3D3 and the second sub-inverted intermediate signal C4D3B. For example, the 23-NAND circuit ND23 may receive the second sub-intermediate signal C3D3 (e.g., reference signs d31 and d32) and the second sub-inverted intermediate signal C4D3B (e.g., reference signs d31 and d32) to output the second inverted data signal BD2 (e.g., d33 and d34) between the third time point t3 and the seventh time point t4 or between the seventh time pint t7 and the eighth time point t8.

According to an embodiment, the third multiplexer 2213 may generate the third inverted data signal BD3, based on the third sub-intermediate signal C2D2 and the third sub-inverted intermediate signal C3D2B. For example, the 33-NAND circuit ND33 may receive the third sub-intermediate signal C2D2 (e.g., reference signs d21 and d22) and the third sub-inverted intermediate signal C3D2B (e.g., reference signs d21 and d22) to output the third inverted data signal BD3 (e.g., d23 and d24) between the second time point t2 and the third time point t3 or between the sixth time point t6 and the seventh time point t7.

According to an embodiment, the fourth multiplexer 2214 may generate the fourth inverted data signal BD4, based on the fourth sub-intermediate signal C4D4 and the fourth sub-inverted intermediate signal C1D4B. For example, the 43th NAND circuit ND43 may receive the fourth sub-intermediate signal C4D4 (e.g., reference signs d41 and d42) and the fourth sub-inverted intermediate signal C1D4B (e.g., reference signs d41 and d42) to output the fourth inverted data signal BD4 (e.g., d43 and d44) between the fourth time point t4 and the second time point t5 or between the eighth time point t8 and the ninth time point t9.

According to an embodiment, the serializing circuit 2215 may output the serial data SD by combining the first inverted data signal BD1, the second inverted data signal BD2, the third inverted data signal BD3, and the fourth inverted data signal BD4. For example, the first NAND circuit ND1 may output the first intermediate signal MD13 by combining the first inverted data signal BD1 (e.g., d13 and d14) and the second inverted data signal BD2 (e.g., d33 and d34). The first intermediate signal MD13 may include the first data D1 and the third data D3 (e.g., d15, d35, d16, and d36) sequentially aligned. The second NAND circuit ND2 may output the second intermediate signal MD24 by combining the third inverted data signal BD3 (e.g., d23 and d24) and the fourth inverted data signal BD4 (e.g., d43, and d44). The second intermediate signal MD24 may include the second data D2 and the fourth data D4 (e.g., d25, d45, d26, and d46) sequentially aligned. The third NAND circuit ND3 may output the serial data SD by receiving a signal, which is obtained as the first intermediate signal MD13 is inverted through the first inverter IV1, and a signal which is obtained as the second intermediate signal MD24 is inverted through the second inverter IV2. The serial data SD may include the first data D1, the second data D2, the third data D3, and the fourth data D4 (e.g., d17, d27, d37, d47, d18, d28, d38, and d48) which are sequentially aligned.

According to an embodiment, the serializer 2210 may maintain uniform performance regardless of the duty ratios of clock signals. For example, the first inverted data signal BD1, the second inverted data signal BD2, the third inverted data signal BD3, and the fourth inverted data signal BD4 may be generated only at the rising edges of the clock signals. The first inverted data signal BD1 (e.g., d13 and d14) may be generated at the rising edge of the first clock signal CK1 and the rising edge of the second clock signal CK2, between the first time point t1 and the second time point t2, or between the fifth time point T5 and the sixth time point t6. The third inverted data signal BD3 (e.g., d23 and d24) may be generated at the rising edge of the second clock signal CK2 and the rising edge of the third clock signal CK3, between the second time point t2 and the third time point t3, or between the sixth time point t6 and the seventh time point t7. The second inverted data signal BD2 (e.g., d33 and d34) may be generated at the rising edge of the third clock signal CK3 and the rising edge of the fourth clock signal CK4, between the third time point t3 and the fourth time point t4, or between the seventh time point t7 and the eighth time point t8. The fourth inverted data signal BD4 (e.g., d43 and d44) may be generated through the rising edge of the fourth clock signal CK4 and the rising edge of the first clock signal CK1, between the fourth time point t4 and the fifth time point t5, or between the eighth time point t8 and the ninth time point t9. The serializer 2210 may acquire data by using the rising edges of two clock signals having specific phase differences (e.g., 90 degrees) instead of acquiring data by using the rising edge and the falling edge of one clock signal. In this case, the serializer 2210 may acquire data with uniform performance regardless of the duty ratios of the clock signals.

Figure 7:
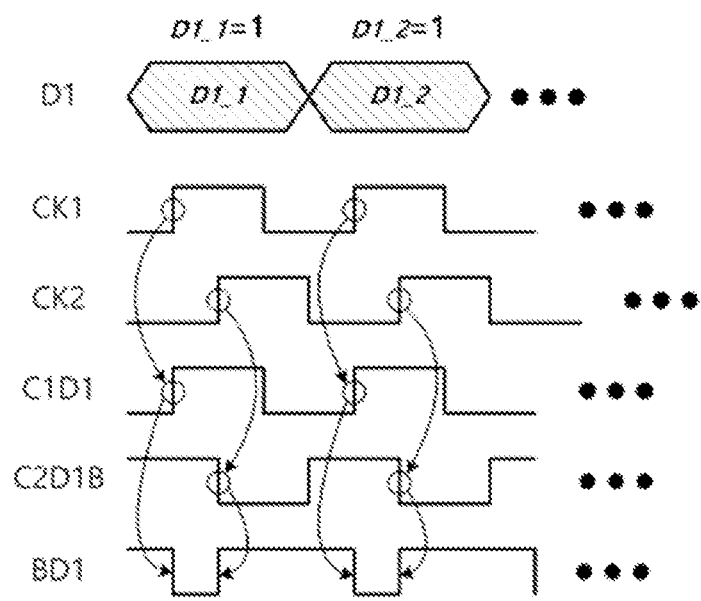
FIG. 7 is a timing diagram illustrating the operation of a serializer, when a data value has a high level (or logic '1') as illustrated in FIGS. 5 and 6.
Figure 8:
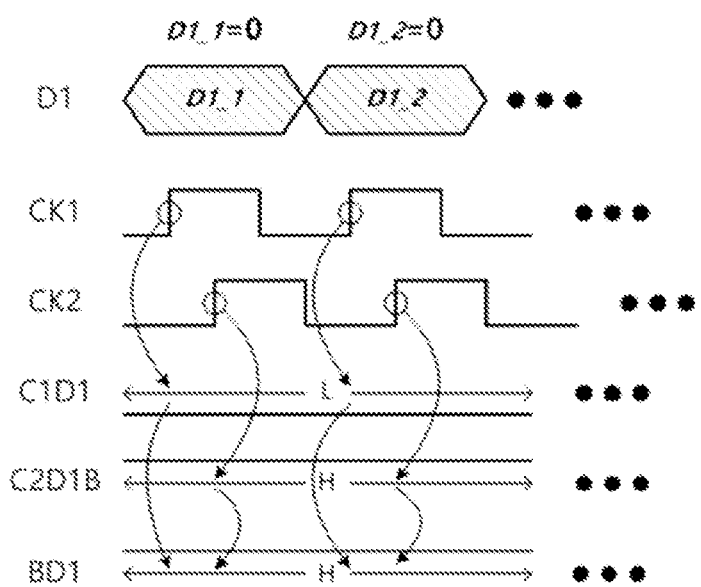
FIG. 8 is a timing diagram illustrating the operation of a serializer, when a data value has a low value (or logic '0'), as illustrated in FIG. 6.

FIG. 7 is a timing diagram illustrating the operation of the serializer, when a data value has a high level (or logic '1'), as illustrated in FIGS. 5 and 6. FIG. 8 is a timing diagram illustrating the operation of the serializer, when a data value has a low value (or logic '0'), as illustrated in FIG. 6. Referring to FIGS. 4, 7, and 8, the serializer 2210 may reduce power consumption, depending on the value of the parallel data PD input therein. Hereinafter, the operation of the serializer 2210 (or the first multiplexer 2211) depending on the value of the first data D1 will be described by way of example.

According to an embodiment, as illustrated in FIG. 7, when the first data D1 is input in a high level (or logic '1') (e.g., D1_1=1 and D1_2=1), both the first data D1 and the first clock signal CK1 are in a high level. Accordingly, the 11th NAND circuit ND11 of the first multiplexer 2211 may output the inverted signal of the first clock signal CK1, and the first sub-intermediate signal C1D1 may be output through the 11th inverter IV11 to have the same waveform as that of the first clock signal CK1. When the first data D1 is input in a high level (or logic '1') (e.g., D1_1=1 and D1_2=1), both the first data D1 and the second clock signal CK2 are in a high level. Accordingly, the 12th NAND circuit ND12 of the first multiplexer 2211 may output the inverted signal of the second clock signal CK2, and the first sub-inverted intermediate signal C2D1B may be output through the first transmission gate T1 to have the same waveform as that of the inverted signal of the second clock signal CK2. Accordingly, the 13th NAND circuit ND13 may output the first inverted data signal BD1 which is toggled at the rising edge of the first clock signal CK1 and the rising edge of the second clock signal CK2. Simultaneously, the second multiplexer 2212 to the fourth multiplexer 2214 may operate in the same manner as that of the first multiplexer 2211.

According to an embodiment, as illustrated in FIG. 8, when the first data D1 is input in a low level (or logic '0') (e.g., D1_1=0 and D1_2=0), both the first data D1 and the first clock signal CK1 are in mutually different levels. Accordingly, the 11th NAND circuit ND11 of the first multiplexer 2211 may consecutively output data in the high level, and the first sub-intermediate signal C1D1 may be output through the 11th inverter IV11 to consecutively have the low level. When the first data D1 is input in a low level (or logic '0') (e.g., D1_1=0 and D1_2=0), both the first data D1 and the second clock signal CK2 are in mutually different levels. Accordingly, the 12th NAND circuit ND12 of the first multiplexer 2211 may consecutively output data in the high level, and the first sub-inverted intermediate signal C2D1B may be output through the first transmission gate T1 to consecutively have the high level. Accordingly, the 13th NAND circuit ND13 may output the first inverted data signal BD1 consecutively having the high level, instead of being toggled at the rising edge of the first clock signal CK1 and the rising edge of the second clock signal CK2. Simultaneously, the second multiplexer 2212 to the fourth multiplexer 2214 may operate in the same manner as that of the first multiplexer 2211.

As described above, according to the present disclosure, the serializer 2210 may make a duration in which internal signals are not toggled, based on the data value (e.g., the data value in the low level or having logic '0'). Accordingly, according to the present disclosure the serializer 2210 may reduce unnecessary power consumption, when compared to the conventional serializer consecutively performing toggling in response to a clock signal regardless of the data value. In addition, when the data value is in the high level or has logic '1', the serializer 2210 according to the present disclosure may toggle the internal signals based on only the rising edges of the clock signals, and may maintain the uniform performance regardless of the duty ratio of the clock signals.

Figure 9:
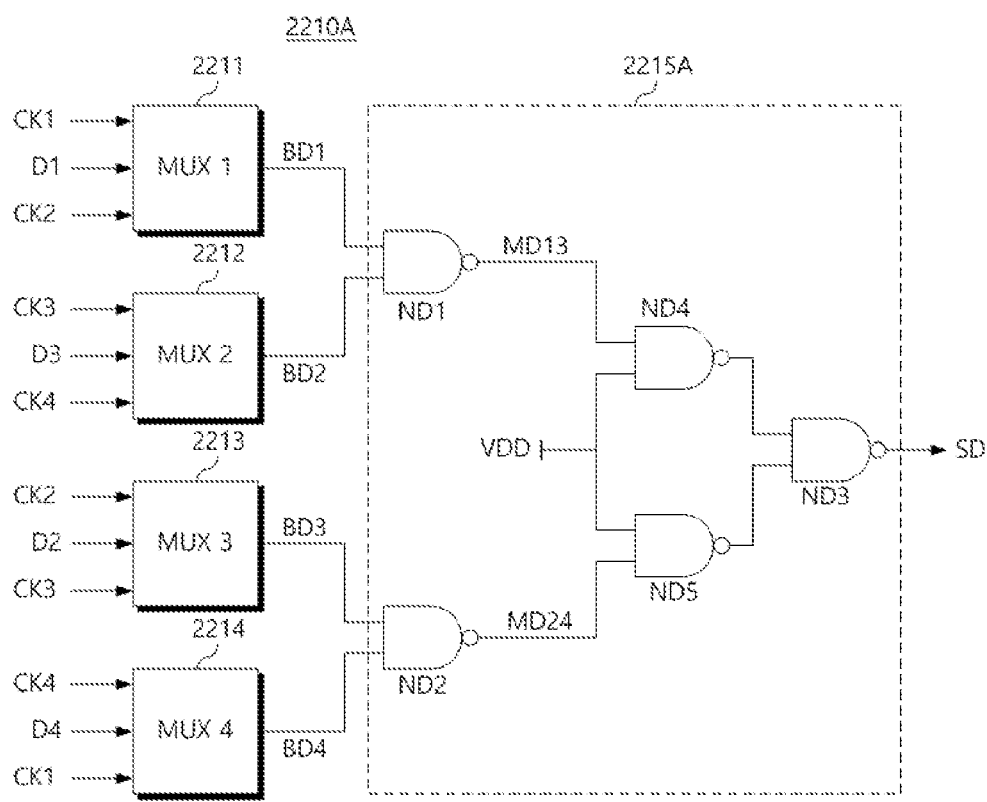
FIG. 9 is a view illustrating a serializer of FIG. 2, according to another embodiment.

FIG. 9 is a view illustrating a serializer of FIG. 2, according to another embodiment. Referring to FIG. 9, a serializer 2210A may include a plurality of multiplexers and a serializing circuit 2215A. The plurality of multiplexers (e.g., the first multiplexer 2211, the second multiplexer 2212, the third multiplexer 2213, and the fourth multiplexer 2214) may have the same components and the same features as those of the first multiplexer 2211, the second multiplexer 2212, the third multiplexer 2213, and the fourth multiplexer 2214 of FIG. 3. Accordingly, in the following description of the serializer of FIG. 9, the details of the same components and features as those of the serializer 2210 of FIG. 2 will be omitted to avoid redundancy.

According to an embodiment, the serializing circuit 2215A may be substantially the same as that of the serializing circuit 2215 of FIG. 3 in component and feature. Accordingly, in the following description of the serializing circuit of FIG. 9, the details of the same components and features as those of the serializer 2215 of FIG. 3 will be omitted to avoid redundancy. The serializing circuit 2215A may include a fourth NAND circuit ND4 and a fifth NAND circuit ND5, instead of the first inverter IV1 and the second inverter IV2 of the serializing circuit 2215 of FIG. 3. For example, the fourth NAND circuit ND4 and the fifth NAND circuit ND5 may be interposed between the first NAND circuit ND1 and the third NAND circuit ND3. The fourth NAND circuit ND4 may generate an output signal by receiving the first intermediate signal MD13 and a power supply voltage VDD. The fifth NAND circuit ND5 may generate an output signal by receiving the second intermediate signal MD24 and the power supply voltage VDD. The output signal of the fourth NAND circuit ND4 and the output signal of the fifth NAND circuit ND5 may be input to the third NAND circuit ND3.

As described above, the serializing circuit 2215A of FIG. 9 may maintain the characteristic of a signal input to the serializing circuit 2215A until the signal is output from the serializing circuit 2215A, by substituting the first inverter IV1 and the second inverter IV2 with the fourth NAND circuit ND4 and the fifth NAND circuit ND5, respectively. The serializing circuit 2215A may adjust the duty ratios of the multiple data (e.g., d17, d27, d37, d47, d18, d28, d38, and d48 of FIG. 6) included in the serial data SD, within an error range.

Figure 10:
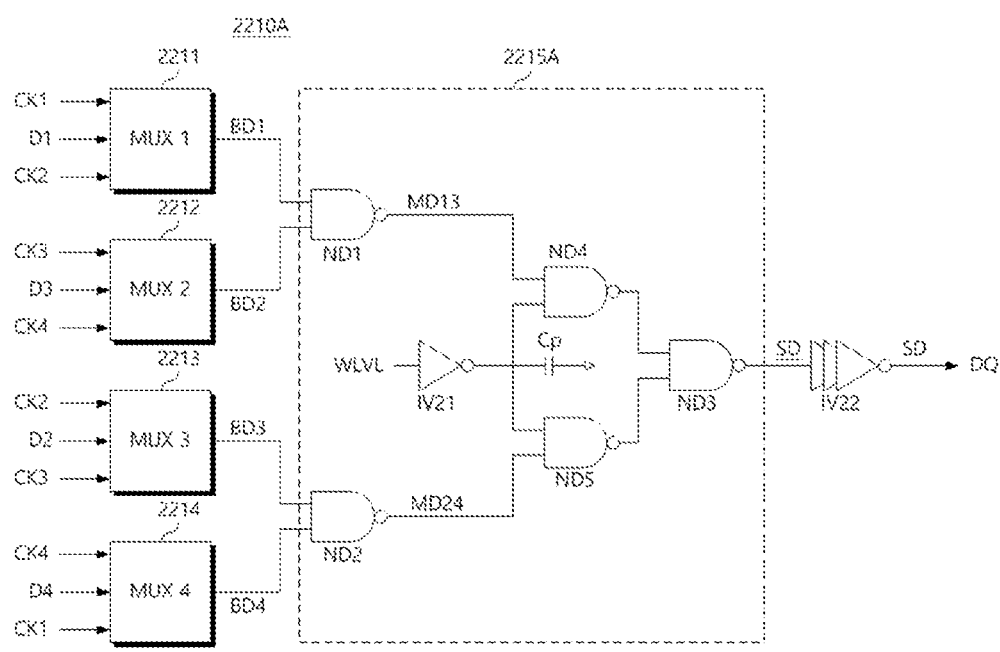
FIG. 10 is a view illustrating the serializer of FIG. 9, which applies a write leveling signal, according to an embodiment.

FIG. 10 is a view illustrating the serializer of FIG. 9, which applies a write leveling signal, according to an embodiment. Referring to FIG. 10, the serializer 2210A may input a write leveling signal WLVL to one input terminal of the fourth NAND circuit ND4 and the fifth NAND circuit ND5.

According to an embodiment, the serializing circuit 2215A may generate serial data SD by combining intermediate signals (e.g., the first intermediate signal MD13 or the second intermediate signal MD24) with a high-voltage write leveling signal WLVL. For example, the write leveling signal WLVL may be inverted and input through a 21th inverter IV21, and inverted serial data $\overline{SD}$ may be output through the third NAND circuit ND3, and then changed to the serial data SD through a 22th inverter IV22. The 22th inverter IV22 may include a plurality of inverters connected in series.

According to an embodiment, the serializing circuit 2215A may transmit the high-voltage write leveling signal WLVL to the data line DQ. However, a parasitic capacitor Cp may be formed at the terminal for inputting the write leveling signal WLVL, as the 21th inverter IV21 is inserted. When the write leveling signal WLVL is input to the third NAND circuit ND3 and the 22th inverter IV22, the parasitic capacitor Cp may be formed at the output terminal of the serializer 2210A, thereby exerting an influence on the bandwidth of the serializer 2210A. However, according to the present disclosure, the serializing circuit 2215A may input the write leveling signal WLVL to the fourth NAND circuit ND4 and the fifth NAND circuit ND5, and may prevent an additional parasitic capacitor from being formed at the output terminal of the serializer 2210A. Therefore, according to the present disclosure, the serializer 2210A may transmit the write leveling signal WLVL to the data line DQ without exerting an influence on the bandwidth of the output terminal.

According to the present disclosure, when the parallel data is converted to the serial data, some of the multiple clock signals having the specific phase difference from each other and the parallel data are combined to reduce the number of times of toggling the internal circuit of the serializer, depending on the value of the parallel data, thereby preventing unnecessary power consumption.

In addition, according to the present disclosure, when the parallel data is converted to the serial data, the data is acquired only at the rising edges of the clock signals, thereby uniformly maintaining the performance of the serializer regardless of the duty ratios of the clock signals.

Further, according to the present disclosure, the bandwidth of the serializer may be ensured by applying only one load to the output terminal of the serializer.

The above description refers to detailed embodiments for carrying out the present disclosure. Embodiments in which a design is changed simply or which are easily changed may be included in the present disclosure as well as an embodiment described above. In addition, technologies that are easily changed and implemented by using the above embodiments may be included in the present disclosure. While the present disclosure has been described with reference to exemplary embodiments thereof, it will be apparent to those of ordinary skill in the art that various changes and modifications may be made thereto without departing from the spirit and scope of the present disclosure as set forth in the following claims.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An integrated circuit memory device, comprising:
a memory core;
control logic configured to control the memory core to: (i) output parallel data, and (ii) generate multiple internal clock signals in response to a clock signal received from a host; and
a data transmitting unit including a serializer configured to convert the parallel data into serial data, said serializer comprising:
a plurality of multiplexers that are each configured to output a respective inverted data signal based on one of the parallel data and two of the internal clock signals having different phases relative to each other; and
a serializing circuit configured to output the serial data by logically combining the inverted data signals output from the plurality of multiplexers; and
wherein each of the plurality of multiplexers acquires inverted data of the one of the parallel data between rising edges of the corresponding two internal clock signals and generates therefrom a corresponding one of the inverted data signals.

2. The memory device of claim 1, wherein the serializing circuit generates intermediate signals such that at least two data of the parallel data are alternately aligned at a specific time interval.

3. The memory device of claim 2, wherein the serializing circuit generates the serial data, which is formed by sequentially aligning all data included in the parallel data by combining the intermediate signals based on specific phase differences therebetween.

4. The memory device of claim 1, wherein the two internal clock signals have a phase difference of 90 degrees.

5. The memory device of claim 1, wherein at least two multiplexers of the plurality of multiplexers receive the same internal clock signal.

6. The memory device of claim 1, wherein one multiplexer of the plurality of multiplexers receives an internal clock signal different from an internal clock signal of another multiplexer of the plurality of multiplexers.

7. The memory device of claim 1, wherein one of internal clock signals input to one multiplexer of the plurality of multiplexers has a phase difference of 90 degrees from one of internal clock signals input to another multiplexer of the plurality of multiplexers.

8. The memory device of claim 1, wherein one of the parallel data is synchronized with a high level duration of one of the two internal clock signals.

9. An integrated circuit memory device, comprising:
a serializer configured to convert a plurality of bits of parallel read data, which are synchronized with a corresponding plurality of clock signals that are out-of-phase relative to each other, into a serial stream of the read data, using a Boolean logic circuit configured to receive each of the plurality of bits of parallel read data and each of the plurality of out-of-phase clock signals at corresponding inputs thereof;
wherein the serializer comprises:
a first multiplexer, which is configured to receive a first of the plurality of bits of parallel read data and first and second ones of the plurality of clock signals; and a second multiplexer, which is configured to receive a third of the plurality of bits of parallel read data and third and fourth ones of the plurality of clock signals.

10. The memory device of claim 9, wherein the serializer further comprises:
a third multiplexer, which is configured to receive a second of the plurality of bits of parallel read data and the second and third ones of the plurality of clock signals; and
a fourth multiplexer, which is configured to receive a fourth of the plurality of bits of parallel read data and the fourth and first ones of the plurality of clock signals.

11. The memory device of claim 9, wherein the first multiplexer comprises:
a first logic gate configured to receive the first one of the plurality of clock signals and the first of the plurality of bits of parallel read data; and
a second logic gate configured to receive the second one of the plurality of clock signals and the first of the plurality of bits of parallel read data.

12. The memory device of claim 9, wherein the second one of the plurality of clock signals is phase-delayed relative to the first one of the plurality of clock signals; wherein the third one of the plurality of clock signals is phase-delayed relative to the second one of the plurality of clock signals; and wherein the fourth one of the plurality of clock signals is phase-delayed relative to the third one of the plurality of clock signals.

13. The memory device of claim 9, wherein the second one of the plurality of clock signals is phase-delayed by 90° relative to the first one of the plurality of clock signals; wherein the third one of the plurality of clock signals is phase-delayed by 90° relative to the second one of the plurality of clock signals; and wherein the fourth one of the plurality of clock signals is phase-delayed by 90° relative to the third one of the plurality of clock signals.

14. The memory device of claim 9, wherein the Boolean logic circuit consists essentially of combinational logic.

15. The memory device of claim 10, wherein the serializer further comprises a serializing circuit having a first logic gate that receives first and second outputs of the first and second multiplexers, respectively, and a second logic gate that receives third and fourth outputs of the third and fourth multiplexers, respectively.

16. The memory device of claim 15, wherein the first logic gate is a two-input NAND gate, and the second logic gate is a two-input NAND gate; and wherein the serializer further comprises combinational logic that performs a logical-OR operation on signals generated at outputs of the first and second NAND gates.

17. The memory device of claim 11, wherein the first logic gate is a two-input NAND gate; and wherein the second logic gate is a two-input NAND gate.

18. A serializer to convert first data, second data, third data, and fourth data, which are input in parallel, to serial data, the serializer comprising:

a first multiplexer configured to output a first inverted data signal corresponding to the first data, based on a first clock signal and a second clock signal;
a second multiplexer configured to output a second inverted data signal corresponding to the third data, based on a third clock signal and a fourth clock signal;
a third multiplexer configured to output a third inverted data signal corresponding to the second data, based on the second clock signal and the third clock signal;
a fourth multiplexer configured to output a fourth inverted data signal corresponding to the fourth data, based on the fourth clock signal and the first clock signal; and
a serializing circuit configured to output the serial data by logically combining the first inverted data signal, the second inverted data signal, the third inverted data signal, and the fourth inverted data signal,
wherein the serializing circuit includes:
a first NAND circuit configured to output a first intermediate signal having the first data and the third data alternately aligned at a specific time interval, by performing a NAND operation for the first inverted data signal and the second inverted data signal;
a second NAND circuit configured to output a second intermediate signal having the second data and the fourth data alternately aligned at a specific time interval, by performing a NAND operation for the third inverted data signal and the fourth inverted data signal;
a third NAND circuit configured to output a first inverted intermediate signal by performing a NAND operation for the first intermediate signal and a power supply voltage signal;
a fourth NAND circuit configured to output a second inverted intermediate signal by performing a NAND operation for the second intermediate signal and the power supply voltage signal; and
a fifth NAND circuit configured to output the serial data having the first data, the second data, the third data, and the fourth data sequentially aligned, by performing a NAND operation for the first inverted intermediate signal and the second inverted intermediate signal.

19. The serializer of claim 18, wherein the third NAND circuit outputs a first write leveling intermediate signal by performing a NAND operation for a write leveling signal substituted for the power supply voltage signal, and the first intermediate signal,
wherein the fourth NAND circuit outputs a second write leveling intermediate signal by performing a NAND operation for the write leveling signal substituted for the power supply voltage signal and the second intermediate signal, and
wherein the fifth NAND circuit outputs the serial data including a high voltage of the write leveling signal by performing a NAND operation for the first write leveling intermediate signal and the second write leveling intermediate signal.

* * * * *